US012796466B2

(12) United States Patent
Shahane et al.

(10) Patent No.: US 12,796,466 B2
(45) Date of Patent: Nov. 10, 2026

(54) SEMICONDUCTOR DEVICE PACKAGE WITH INTEGRAL THERMAL DISSIPATION STRUCTURE

(71) Applicant: Texas Instruments Incorporated, Dallas, TX (US)

(72) Inventors: Ninad Shahane, San Francisco, CA (US); Vivek Arora, San Jose, CA (US); Kwang-Soo Kim, Sunnyvale, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 442 days.

(21) Appl. No.: 18/479,000

(22) Filed: Sep. 30, 2023

(65) Prior Publication Data

US 2025/0112114 A1 Apr. 3, 2025

(51) Int. Cl.
*H10W 40/25* (2026.01)
*H10W 70/40* (2026.01)
(Continued)

(52) U.S. Cl.
CPC ....... *H10W 40/255* (2026.01); *H10W 70/424* (2026.01); *H10W 74/01* (2026.01);
(Continued)

(58) Field of Classification Search
CPC ............. H10W 40/255; H10W 70/424; H10W 74/01; H10W 74/111; H10W 72/073;
(Continued)

(56) References Cited

U.S. PATENT DOCUMENTS

| | | | | |
|---|---|---|---|---|
| 5,736,786 | A * | 4/1998 | Sankaran | H01L 23/3735 257/E23.106 |
| 2014/0167238 | A1* | 6/2014 | Jeon | H01L 23/49575 257/676 |
| 2017/0025336 | A1* | 1/2017 | Padmanabhan | H01L 23/49575 |
| 2022/0208661 | A1* | 6/2022 | Zhang | H01L 23/49551 |
| 2023/0298979 | A1* | 9/2023 | Tuncer | G01K 1/08 |

OTHER PUBLICATIONS

Quek, Y.B., QFN Layout Guidelines, Texas Instruments Jul. 2006. (Year: 2006).*
Abdullah, S., et al., "Thermal-mechanical analysis of a different leadframe thickness of semiconductor package under the reflow process." American Journal of Applied Sciences, vol. 6, No. 4, Apr. 1, 2009, pp. 616-625, https://doi.org/10.3844/ajassp.2009.616.625 (Year: 2009).*

(Continued)

*Primary Examiner* — Joe Schoenholtz
(74) *Attorney, Agent, or Firm* — Xiaotun Qiu; Charles F. Koch

(57) ABSTRACT

An example includes: a package substrate having a die pad with a device side surface and a thermal pad on an opposite side surface; a thermal dissipation structure mounted to the die pad, the thermal dissipation structure including a thermally conductive insulator core and thermal conductors on a device side surface and on a substrate mount surface opposite the device side surface; at least one semiconductor device die mounted to the device side surface of the thermal dissipation structure; electrical connections formed between leads on the package substrate and bond pads on the at least one semiconductor device die; and mold compound covering the electrical connections, the at least one semiconductor device, and portions of the package substrate, portions of the leads of the package substrate forming terminals, and the thermal pad exposed from the mold compound and forming a thermal pad for a semiconductor device package.

25 Claims, 14 Drawing Sheets

(51) Int. Cl.
*H10W 72/00* (2026.01)
*H10W 74/01* (2026.01)
*H10W 74/10* (2026.01)
*H10W 90/00* (2026.01)

(52) U.S. Cl.
CPC ........ *H10W 74/111* (2026.01); *H10W 72/073* (2026.01); *H10W 72/075* (2026.01); *H10W 72/884* (2026.01); *H10W 90/736* (2026.01); *H10W 90/756* (2026.01)

(58) Field of Classification Search
CPC ............. H10W 72/075; H10W 72/884; H10W 90/736; H10W 90/756; H10W 70/461; H10W 70/468; H10W 90/811
See application file for complete search history.

(56) References Cited

OTHER PUBLICATIONS

"Thermal Considerations of QFN and Other Exposed-Paddle Packages", Maxim Integrated Technologies, Application Note HFAN-08.1 Rev Apr. 1, 2008. (Year: 2008).*
International Search Report PCT/US2023/086453 Jun. 18, 2024. (Year: 2024).*
Texas Instruments Incorporated, "Application Report—Thermal Design and Performance of Top-Side Cooled QFN 12×12 Package for Automotive 650-V GaN Power Stage", SNOAA70, Mar. 2021; retreived from the world wide web at uniform resource locator (url) address: https://www.ti.com/lit/an/snoaa70/snoaa70.pdf?ts=1696047748230&ref_url=https%253A%252F%252Fwww.google.com%252F on Sep. 29, 2023.

* cited by examiner

SEMICONDUCTOR DEVICE PACKAGE WITH INTEGRAL THERMAL DISSIPATION STRUCTURE

TECHNICAL FIELD

This disclosure relates generally to packaging electronic devices, and more particularly to packaged semiconductor devices for power applications such as supplying current to a load, power converters, and switching power supplies.

BACKGROUND

Processes for producing packaged semiconductor devices include mounting the semiconductor devices to a package substrate, and covering the semiconductor devices with mold compound to form packages. The molding processes may be done on single devices, or may be done on multiple devices simultaneously. The molded semiconductor devices may be arranged in a strip of devices adjacent to one another, or in a two-dimensional array of devices in rows and columns on a package substrate, such as lead frame strips or arrays. Once the semiconductor device packages are complete, the packages are separated from one another. In one method to separate the device packages from one another, a saw is used. The saw cuts through the mold compound and through the package substrate material along saw streets defined between the semiconductor device packages, in order to separate the packages into units.

In certain semiconductor device packages, electrical isolation is needed between devices, or between devices and portions of the package. In power applications, a power switch device such as a metal oxide semiconductor (MOS) field effect transistor (FET or MOSFET) can be placed in a device package. Some power FETs can be formed in a semiconductor process particularly suitable for power devices, such as Gallium Nitride (GaN) FET (or GaN FET) devices, or for a silicon based device, Silicon Carbide (SiC) FET (or SiC FET) devices. Power FETs can be fabricated in semiconductor processes specifically arranged to provide low resistance from drain-to-source in a power FET when it is turned on (low Rdson) to allow high current to safely flow through the device without excessive heat loss. When power semiconductor devices are packaged, a controller or gate driver semiconductor device can be packaged in the same semiconductor device package as the power FET device to provide an integrated solution. The two devices may operate on isolated power and grounds, and thus the devices need to be electrically isolated from one another. In addition, thermal dissipation is needed to remove heat from the devices and from the semiconductor device package. In one approach, a package substrate has a die attach pad that acts as a thermal path, and the package has a die attach pad surface exposed from the mold compound that forms the package body to form a thermal pad. The die attach pad is often grounded, and often needs to be electrically isolated from the semiconductor devices. A thermally conductive and electrically isolating material is placed between the semiconductor device dies and the die attach paddle.

In one prior approach, thermal interface material (TIM) is used within the semiconductor device package. The TIM can be a paste or gel material that is dispensed and then cured, or partially cured, or can be a sheet material. TIM materials that have sufficient thermal transfer properties for use in power semiconductor device packages add substantial costs. In addition, paste or gel TIM materials tend to form voids or other defects during manufacturing processes, increasing thermal resistance and degrading thermal performance of the packaged devices, and voids in the TIM materials can cause "hot spots" that result in a device package failing post manufacture tests and being scrapped, which increases production costs. TIM films are substantially more expensive than the other materials used in a semiconductor device package and therefore are undesirable for cost reasons.

Power FETs generate substantial heat when operating. Semiconductor device packages with low thermal resistance, and which are low in cost, are needed for power devices. Ideally, the semiconductor device packages for power devices should be compatible with existing materials, use existing manufacturing processes and existing tooling to keep the costs of implementing packaging solutions low. Use of semiconductor device packages for power devices in standard package sizes and having compatibility with existing package board outlines is also desirable. To increase performance and power handling capabilities for packaged semiconductor devices in molded packages, thermal dissipation from the semiconductor device packages needs to be increased over known approaches.

SUMMARY

In a described example, a method includes: forming a thermal dissipation structure that includes a thermally conductive insulator core and having a device side surface and having an opposite substrate mount surface; mounting the substrate mount surface of the thermal dissipation structure to a device side surface of a die pad of a package substrate, the die pad having an opposite side surface forming a thermal pad; placing die attach material on thermal conductors on the device side surface of the thermal dissipation structure; mounting at least one semiconductor device die on the device side surface of the thermal dissipation structure using the die attach material; forming electrical connections comprising wire bonds or ribbon bonds between leads on the package substrate spaced from the die pad and bond pads on the at least one semiconductor device die; and covering the electrical connections, the at least one semiconductor device die, and portions of the package substrate with mold compound, portions of the leads of the package substrate exposed from the mold compound and forming terminals for a semiconductor device package, and the thermal pad of the package substrate exposed from the mold compound and forming a thermal pad for the semiconductor device package.

In another described example, an apparatus includes: a package substrate having a die pad with a device side surface and a thermal pad on an opposite side surface of the die pad and having leads spaced from the die pad; a thermal dissipation structure mounted to the device side surface of the die pad, the thermal dissipation structure comprising a thermally conductive insulator core and having thermal conductors on a device side surface and on a substrate mount surface opposite the device side surface; at least one semiconductor device die mounted to the device side surface of the thermal dissipation structure using a die attach material; electrical connections formed between leads on the package substrate spaced from the die pad and bond pads on the at least one semiconductor device die; and mold compound covering the electrical connections, the at least one semiconductor device, and portions of the package substrate, portions of the leads of the package substrate exposed from the mold compound and forming terminals for a semiconductor device package, and the thermal pad of the package substrate exposed from the mold compound and forming a thermal pad for the semiconductor device package.

In another described example, a semiconductor device package includes a metal lead frame having a die pad with a device side surface and having a thermal pad on an opposite side surface of the die pad, and having leads spaced from the die pad; a thermal dissipation structure mounted to the device side surface of the die pad, the thermal dissipation structure including a thermally conductive insulator core and thermal conductors on a substrate mount surface of the thermally conductive insulator core and on a device side surface of the thermally conductive insulator core arranged for mounting at least one semiconductor device; at least one semiconductor device die mounted to the device side surface of the thermal dissipation structure using a die attach material; electrical connections formed between leads on the lead frame and bond pads on the at least one semiconductor device die; and mold compound covering the electrical connections, the at least one semiconductor device, and portions of the package substrate, portions of the leads of the package substrate exposed from the mold compound and forming terminals for a semiconductor device package, and the thermal pad of the package substrate exposed from the mold compound and forming a thermal pad for the semiconductor device package.

DETAILED DESCRIPTION

Figure 1A:
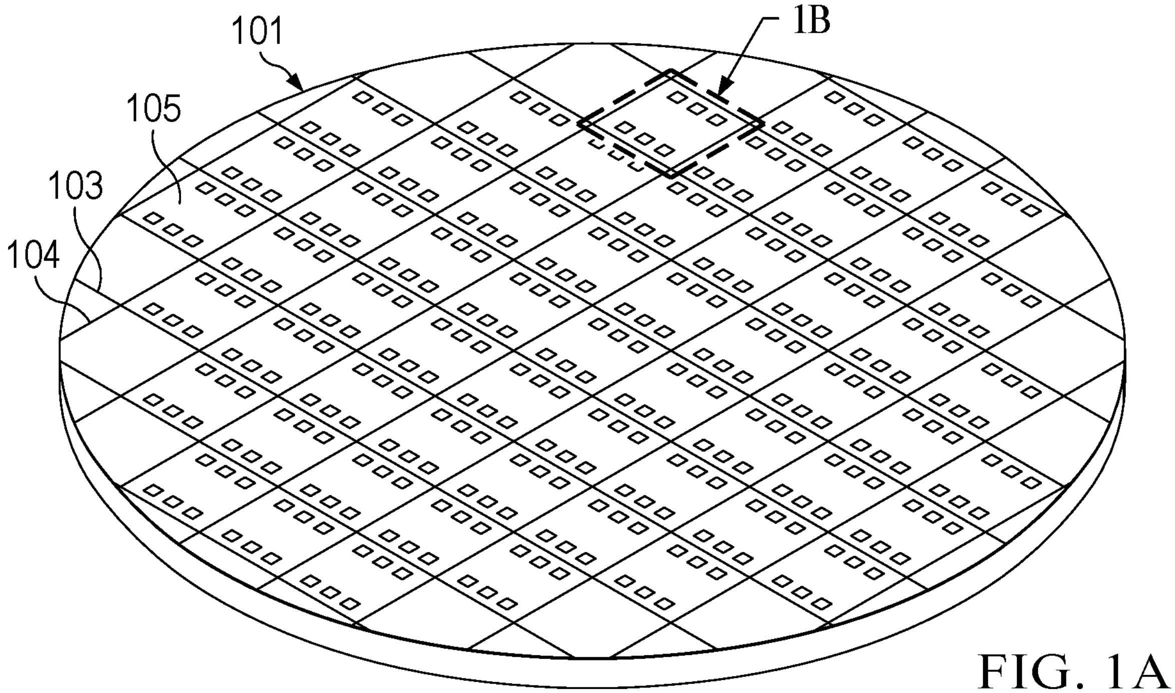
FIGS. 1A-1B illustrate in a projection view, and in a close-up projection view, respectively, a semiconductor wafer with semiconductor dies formed thereon, and a single semiconductor die taken from the semiconductor wafer.

Corresponding numerals and symbols in the different figures generally refer to corresponding parts, unless otherwise indicated. The figures are not necessarily drawn to scale.

Elements are described herein as "coupled." The term "coupled" includes elements that are directly connected and elements that are indirectly connected, and elements that are electrically connected even with intervening elements or wires are coupled.

The terms "semiconductor die" and "semiconductor device die" are used herein. As used herein, a semiconductor die or semiconductor device die can be a discrete semiconductor device such as a bipolar transistor, a few discrete devices such as one or a pair of power field effect transistor (FET) switches fabricated together on a single semiconductor die, or a semiconductor die can be an integrated circuit with multiple semiconductor devices such as the multiple capacitors in an A/D converter. The semiconductor die can include passive devices such as resistors, inductors, filters, or active devices such as transistors. The semiconductor die can be an integrated circuit with hundreds or thousands of transistors coupled to form a functional circuit, for example a microprocessor or memory device. The semiconductor device die can be a passive device such as a sensor, example sensors include photocells, transducers, and charge coupled devices (CCDs), or can be a micro electro-mechanical system (MEMS) device, such as a digital micromirror device (DMD). In an example, a power FET is provided on a first semiconductor device die, and a gate driver device or switch controller device can be provided on a second semiconductor device die placed in the same package, while the devices are electrically isolated from one another.

The term "semiconductor device package" is used herein. A semiconductor device package has at least one semiconductor device die electronically coupled to terminals and has a package body that protects and covers the semiconductor die. In some arrangements, multiple semiconductor dies can be packaged together. For example, a power metal oxide semiconductor (MOS) field effect transistor (power FET) semiconductor die and a logic semiconductor die (such as a gate driver die or a controller die) can be packaged together to from a single packaged electronic device. Additional components such as passives can be included in the packaged electronic device. The semiconductor die is mounted to a package substrate that provides conductive leads; a portion of the conductive leads form the terminals for the packaged electronic device. The semiconductor die can be mounted to the package substrate with an active device surface facing away from the substrate and a backside surface facing the package substrate. The packaged electronic device can have a package body formed by a thermoset epoxy resin in a molding process, or by the use of epoxy, plastics, or resins that are liquid at room temperature and are subsequently cured. The package body may provide a hermetic package for the packaged electronic device. The package body may be formed in a mold using an encapsulation process, however, a portion of the leads of the package substrate are not covered during encapsulation, these exposed lead portions provide the exposed terminals for the packaged electronic device.

The term "package substrate" is used herein. A package substrate is a substrate arranged to receive a semiconductor die and to support the semiconductor die in a completed semiconductor package. Package substrates useful with the arrangements include conductive lead frames, which can be formed from copper, aluminum, stainless steel and alloys such as Alloy 42 and copper alloys. The lead frames can include die pads that provide a die mounting area for mounting a semiconductor die, and conductive leads arranged proximate to the die pad for coupling to bond pads on the semiconductor die using wire bonds, ribbon bonds, or other conductors. The opposite side surface of the die pad can form a thermal pad to carry heat away from the semiconductor devices mounted on the die pad. The lead frames can be provided in strips or arrays. Dies can be placed on the strips or arrays, the dies placed on a die pad for the packaged devices, and die attach or die adhesive can be used to mount the dies to the lead frame die pads. In wire bonded packages, wire bonds can couple bond pads on the semiconductor dies to the leads of the lead frames. After the wire bonds are in place, a portion of the substrate, the die, and at least a portion of the die pad can be covered with a protective material such as a mold compound.

Alternative package substrates include pre-molded lead frames (PMLF), molded interconnect substrates (MIS) for receiving semiconductor dies, and multilayer build-up substrates. These package substrates can include dielectrics such as liquid crystal polymer (LCP) or mold compound, and can include one or more layers of conductive portions in the dielectrics. Repeated plating and patterning can form multiple layers of conductors spaced by dielectrics, and conductive vias connecting the conductor layers through the dielectrics, the dielectrics can be mold compound. The package substrate can include lead frames, and can include plated, stamped and partially etched lead frames. In a partially etched lead frame, two levels of metal can be formed by etching a pattern from one side of a metal substrate configured for lead frames, and then etching from the other side, to form full thickness and partial thickness portions, and in some areas, all of the metal can be etched through to form openings through the partial etch lead frames. The package substrate can also be tape-based and film-based, and these can form substrates carrying conductors. Ceramic substrates, laminate substrates with multiple layers of conductors and insulator layers; and printed circuit board substrates of ceramic, fiberglass or resin, or glass reinforced epoxy substrates such as flame retardant 4 (FR4) can be used as the package substrates.

A package substrate, such as a lead frame, MIS, or PMLF substrate, will have conductive portions on a die side surface. Leads of a metal lead frame are conductive all along the surfaces, while for other substrate types, conductive lands in dielectric substrate material are arranged and aligned to electrically and mechanically connect to semiconductor dies using wire bonds or conductive post connects.

The term "thermal dissipation structure" is used herein. A "thermal dissipation structure" includes a thermally conductive insulator core. In the arrangements the thermal dissipation structure is placed between a die pad of a package substrate and a semiconductor device die in a semiconductor device package to conduct thermal energy away from the semiconductor die and out of the package. In the arrangements, the thermal dissipation structure includes a thermally conductive insulator core, for example ceramic material. The backside surface of the die pad of the package substrate forms a thermal pad, and when the semiconductor device package body is formed using mold compound, the thermal pad is exposed from the mold compound, providing thermal dissipation for the semiconductor device package. In some example arrangements, the thermal pad is on a bottom or board side surface of the substrate, and when the device is surface mounted on a system board using surface mount technology (SMT), the thermal pad can be mounted to a thermal path on a system board. In this example, the semiconductor dies are on a top side of the die pad of the package substrate and the thermal dissipation structure thermally couples the dies to the die pad by the ceramic, while the semiconductor dies remain electrically isolated from the die pad. In alternative arrangements, a top side cooling approach is used. The thermal pad of the substrate in the top side cooling arrangements has a surface that is exposed at the top surface of the molded semiconductor device package to provide thermal dissipation for the semiconductor device package. In the top side cooling packages, the semiconductor dies are mounted one the die pad of the package substrate and facing a board side surface of the semiconductor device package. The thermal dissipation structure is mounted between the backside of the dies and the die pad, and the dies are thermally coupled to the die pad by the ceramic material of the thermal dissipation structure. Mold compound covers the dies and portions of the package substrate, such as a metal lead frame. In a top side cooling package, a thermal pad is exposed at the top side of the molded semiconductor device package to provide the thermal dissipation. Cooling can be used to cool the top side of the package, such as forced air, gas or liquid, and a heat sink can be used to increase thermal dissipation by mounting the heat sink to the top side thermal pad.

In packaging semiconductor devices, electronic mold compound (sometimes referred to as "EMC") may be used to partially cover a package substrate, to cover the semiconductor die, and to cover the connections from the semiconductor die to the package substrate. This can be referred to as an "encapsulation" process, although some portions of the package substrates are not covered in the mold compound during encapsulation, for example terminals and leads are exposed from the mold compound. Encapsulation is often a compressive molding process, where thermoset mold compound such as resin epoxy can be used. A room temperature solid or powder mold compound can be heated to a liquid state and then molding can be performed. Transfer molding can be used. Unit molds shaped to surround an individual device may be used, or block molding may be used, to form the packages simultaneously for several devices from mold compound. The devices can be provided in an array of several, hundreds or even thousands of devices in rows and columns that are molded together. After the molding, the individual packaged devices are cut from each other in a sawing operation by cutting through the mold compound and package substrate in saw streets formed between the devices. Portions of the package substrate leads are exposed from the mold compound package to form terminals for the packaged semiconductor device.

The term "scribe lane" is used herein. A scribe lane is a portion of semiconductor wafer between semiconductor dies. Sometimes in related literature the term "scribe street" is used. Once semiconductor processing is finished and the semiconductor devices are complete, the semiconductor devices are separated into individual semiconductor dies by severing the semiconductor wafer along the scribe lanes. The separated dies can then be removed and handled individually for further processing. This process of removing dies from a wafer is referred to as "singulation" or sometimes referred to as "dicing." Scribe lanes are arranged on four sides of semiconductor dies and when the dies are singulated from one another, rectangular semiconductor dies are formed.

The term "saw street" is used herein. A saw street is an area between molded electronic devices used to allow a saw, such as a mechanical blade, laser or other cutting tool to pass between the molded electronic devices to separate the devices from one another. This process is another form of singulation. When the molded electronic devices are provided in a strip with one device adjacent another device along the strip, the saw streets are parallel and normal to the length of the strip. When the molded electronic devices are provided in an array of devices in rows and columns, the saw streets include two groups of parallel saw streets, the two groups are normal to each other and so the saw will traverse the molded electronic devices in two different directions to cut apart the packaged electronic devices from one another in the array.

The term "quad flat no-lead" or "QFN" is used herein for a type of electronic device package. A QFN package has conductive leads that are coextensive with the sides of a molded package body and the leads are on four sides. Alternative flat no-lead packages may have leads on two sides or only on one side. These can be referred to as "small outline no-lead" or "SON" packages. No-lead packaged electronic devices can be surface mounted to a board. Leaded packages can be used with the arrangements where the leads extend away from the package body and are shaped to form a portion for soldering to a board. A dual in line package (DIP) can be used with the arrangements. A small outline package (SOP) can be used with the arrangements. SON packages can be used, and in an alternative a small outline transistor (SOT) package is a leaded package that can be used with the arrangements. Semiconductor device packages can include QFN packages, TsQFN packages, and leaded packages such as dual in-line packages ("DIP") packages, and other leaded packages where leads extend from the molded package body and form feet for mounting to a system board.

The term "top side QFN" or "TsQFN" is used herein for a particular type of QFN package. In a TsQFN package, the thermal pad formed by a surface of the package substrate is exposed on the top surface of a semiconductor device package. In the arrangements, the semiconductor dies are mounted on a bottom surface of the package substrate, the board side, and coupled to the die pad by the thermal dissipation structure, which includes a ceramic material that is thermally conductive and electrically isolating.

In the arrangements, a thermal dissipation structure is formed. A package substrate has a die pad in a central portion. A ceramic material that is thermally conductive but which is electrically insulating is mounted to a die side surface of the die pad, for example using solder, sintered silver or another thermally conductive material. One or more semiconductor dies are mounted to the ceramic material using die attach material (die attach film or die attach paste can be used). In a particular example, the thermal dissipation structure includes a direct bonded copper (DBC) substrate with copper layers plated on opposite sides of a ceramic core. DBC substrates that are commercially available use alumina ($Al_2O_3$) or aluminum nitride (AlN) as ceramic cores. Other thermally conductive materials such as silicon nitride ($Si_3N_4$), can be used as the core. In alternative arrangements, an insulated metal substrate (IMS) can be used which is similar to the direct bonded copper substrate. An insulated metal substrate has metal covered by a dielectric layer to form the thermally conductive insulator core, and copper can be plated on opposite surfaces of the core. Ceramic substates that can be used include active metal brazed (AMB) ceramic substrates. Laminate substrates can be used, although thermal dissipation is less than that of ceramic substrates. In the illustrated examples, direct bonded copper (DBC) substrates are shown. DBC substrates have copper layers formed on opposite side surfaces of the ceramic core.

In an example arrangement with two semiconductor dies such as a power FET and a FET gate driver, copper on a device side surface of the DBC substrate can be patterned to form two die mounting areas that are electrically isolated from one another, allowing a potential to be applied to the backside surface of one or both of the semiconductor dies, for example to connect a ground potential to the source for a power FET device. The thermal dissipation structure is mounted to a die pad of a package substrate. The surface of the package substrate opposite the die pad surface forms a thermal pad for the packaged semiconductor device, and remains exposed when mold compound forms the body of the packaged semiconductor device. Use of the thermal dissipation structures of the arrangements eliminates the TIM materials of prior approaches, preventing voids and defects in TIM paste layers, and reducing costs over TIM film materials. Ceramic substrates such as DBC substrates are readily available and relatively low in cost, have excellent thermal conductivity, and can be mounted in the packages using existing packaging tools and materials. The thermal resistance obtained for a completed semiconductor device package using the arrangements is lower (when compared to a similar semiconductor device package formed using TIM materials), improving the performance of the semiconductor device packages while lowering costs.

Figure 1B:
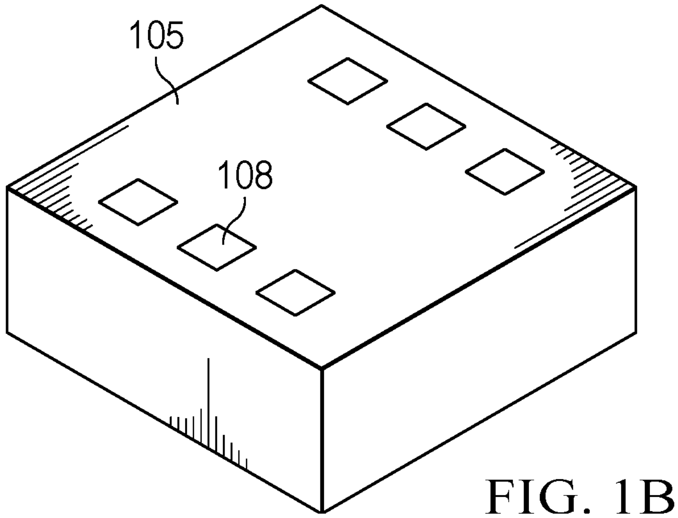

FIGS. 1A-1B illustrate in projection views a semiconductor wafer 101, and a semiconductor die 105 from the semiconductor wafer 101, respectively. In FIG. 1A, the semiconductor wafer 101 has semiconductor dies 105 arranged in rows and columns on a device side surface. Scribe lanes 103 and 104 run in two perpendicular directions between the semiconductor dies 105 on the device side surface of semiconductor wafer 101. After the wafer fabrication processes complete the semiconductor dies 105, the semiconductor wafer 101 is diced into individual semiconductor dies 105 by a dicing saw, by a dicing laser, by a plasma dicing process, or by combination of these, by cutting along the scribe lanes 103 and 104.

In FIG. 1B, semiconductor die 105 is shown after singulation with bond pads 108 on a device side surface. The bond pads 108 provide electrical connection to the transistors or other components formed in the semiconductor die 105 (not shown). In addition, the backside surface of the semiconductor die 105 may provide an additional electrical connection, for example in vertical power FET devices the backside surface may be the source terminal for the vertical FET device.

Figure 2A:
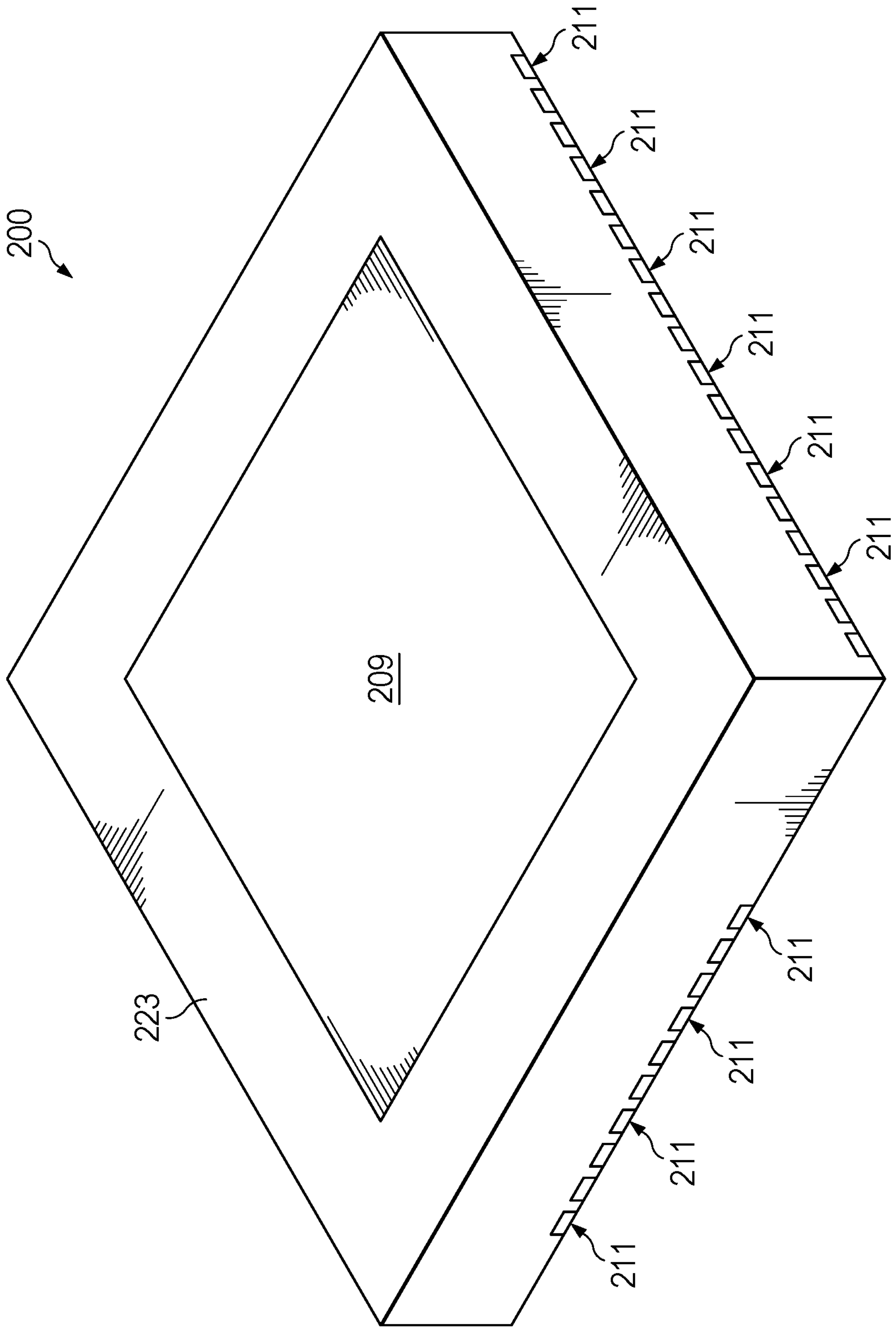
FIGS. 2A-2B illustrate, in a projection view looking from a top side, and from a bottom side respectively, a top-side cooled quad flat no-lead (TsQFN) package that is useful with an arrangement.
Figure 2B:
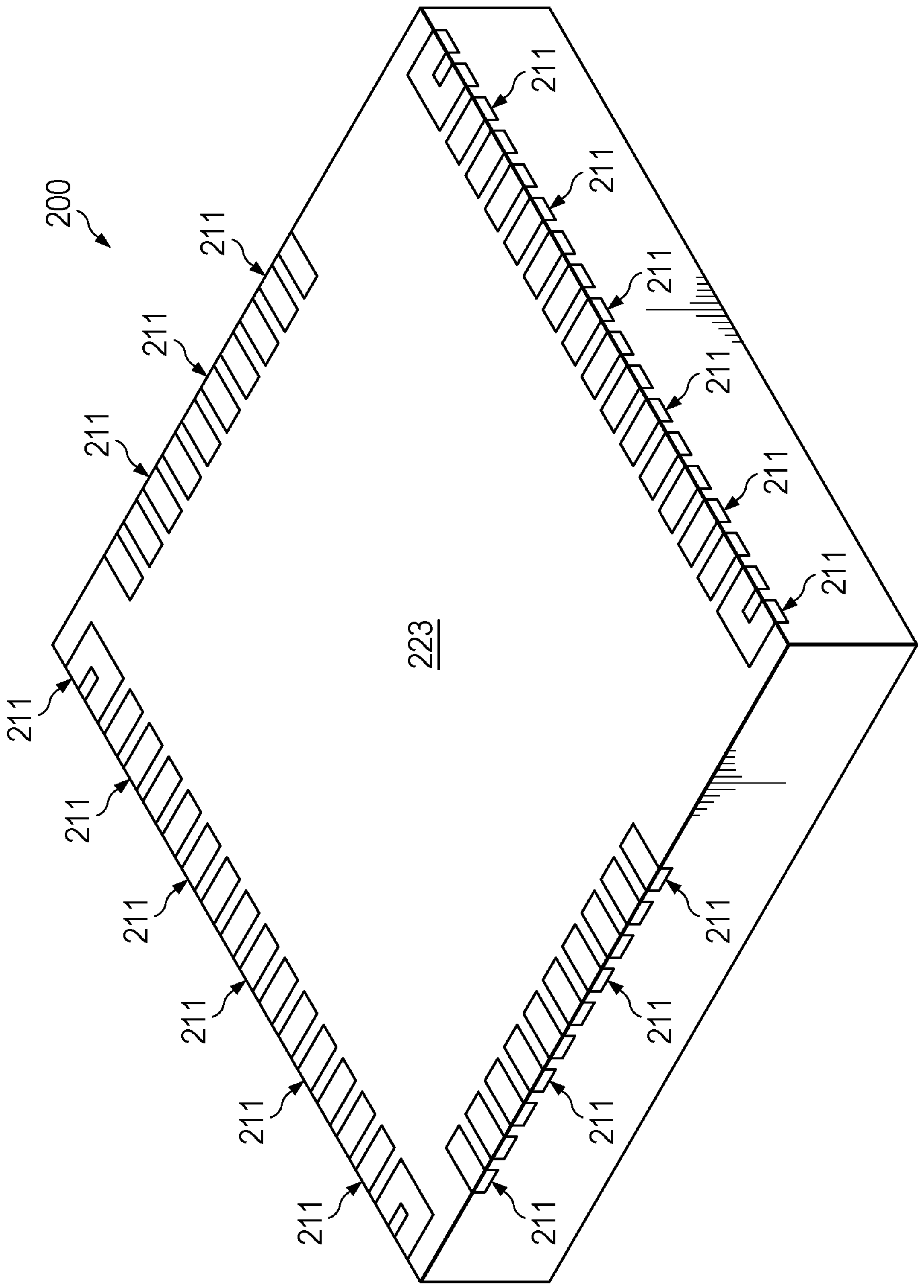

FIGS. 2A-2B illustrate, in projection views, a top side view and a bottom or board side view of a TsQFN package 200 that can be used with an arrangement. The arrangements can also be used with other semiconductor device packages. As shown in FIG. 2A, the TsQFN semiconductor device package 200 has terminals 211 and a thermal pad 209 that is exposed from mold compound 223 that forms the package body. The thermal pad 209 is a backside surface of a die pad that carries the thermal dissipation structure (not shown) and the semiconductor dies (not shown) inside the TsQFN package 200 as described further below.

FIG. 2B illustrates, in a bottom or board side view, the TsQFN package 200 of FIG. 2A, with terminals 211 shown exposed from the mold compound 223 that forms the package body. The terminals 211 are "no-lead" terminals, and as shown in FIG. 2B, the terminals 211 can have a "wettable" dimpled or curved outer side surface to increase solderability in a surface mount technology (SMT) mounting process by increasing the area solder can adhere to on the terminals 211. Alternatively, the terminals 211 can have a square outer side surface so that the bottom side of the terminals 211 are soldered to a system board in an SMT process.

Figure 3A:
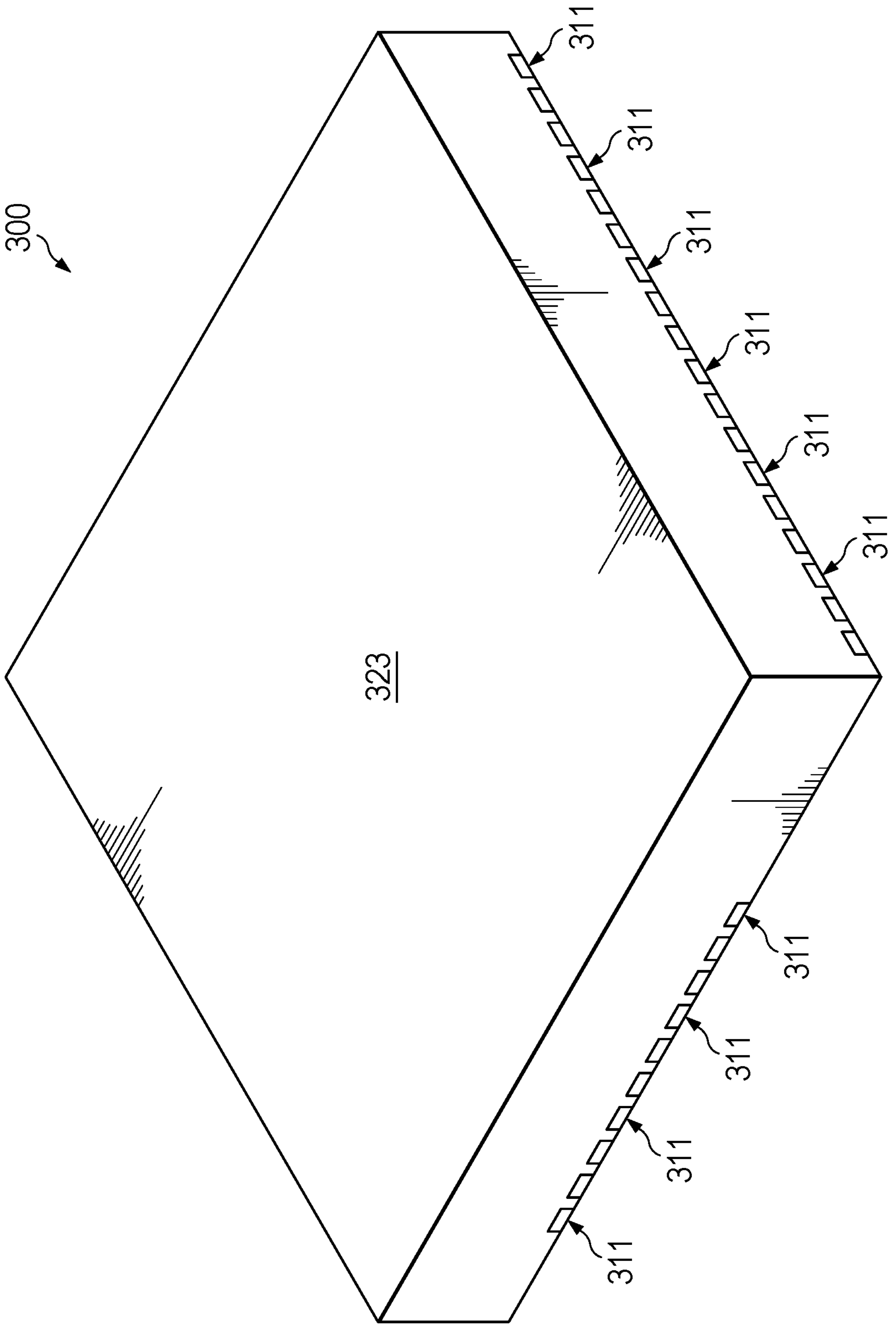
FIGS. 3A-3B illustrate, in projection views from a top side and a bottom side, respectively, a QFN package with an exposed thermal pad on the bottom side that is useful with the arrangements.
Figure 3B:
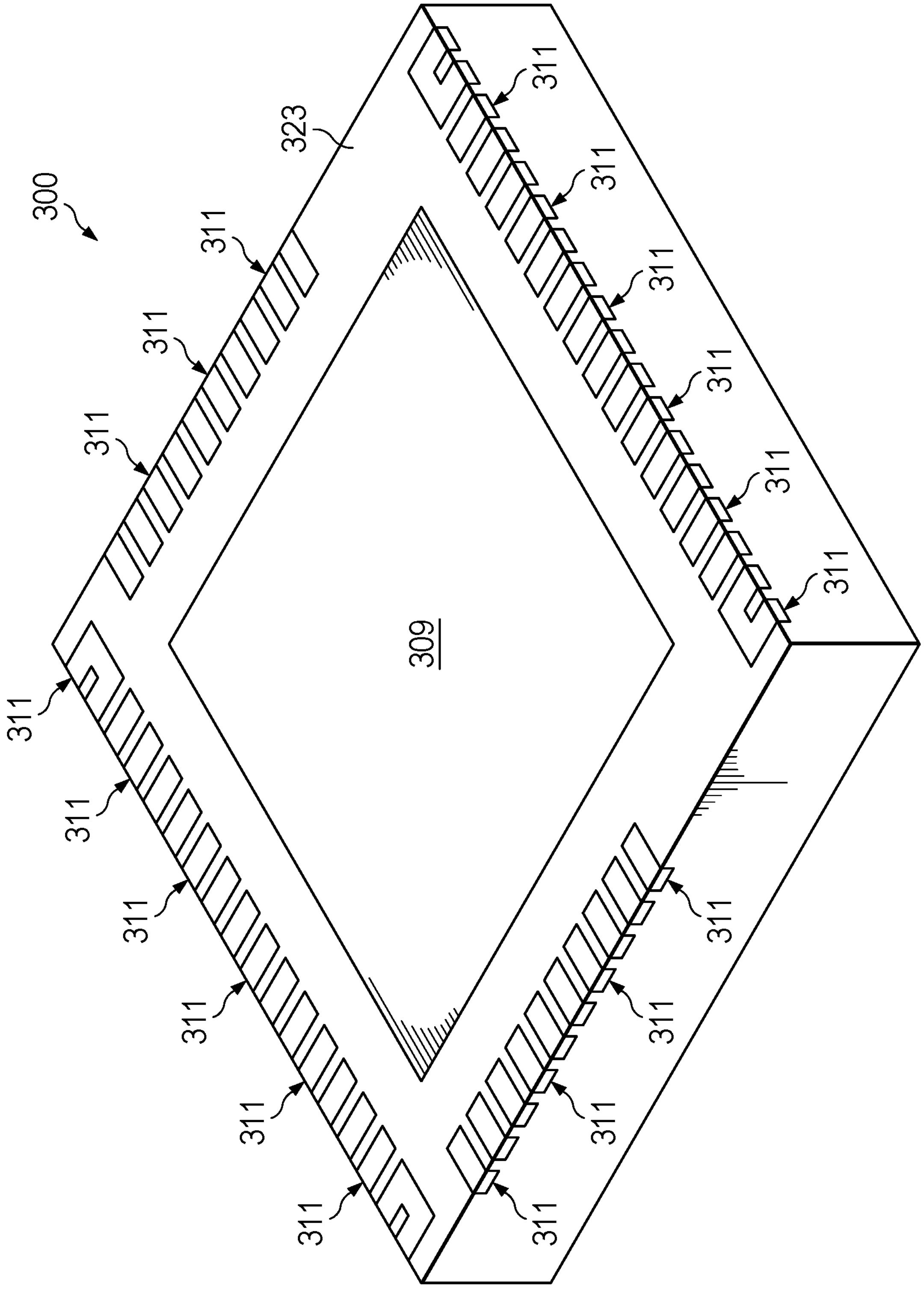

FIGS. 3A and 3B illustrate, in a top side projection view and a bottom or board side projection view, respectively, an alternative QFN semiconductor device package 300 that can be used with the arrangements. In FIG. 3A, the top side view shows the mold compound 323 that forms the package body for QFN 300, and terminals 311 are visible at the bottom surface of the sides of the package body.

FIG. 3B illustrates a bottom or board side view of the QFN 300, and the thermal pad 309 is shown exposed from the mold compound 323, and terminals 311 are shown exposed from the mold compound 323, the thermal pad 309 and terminals 311 are configured for surface mounting to a system board using SMT.

Figure 4A:
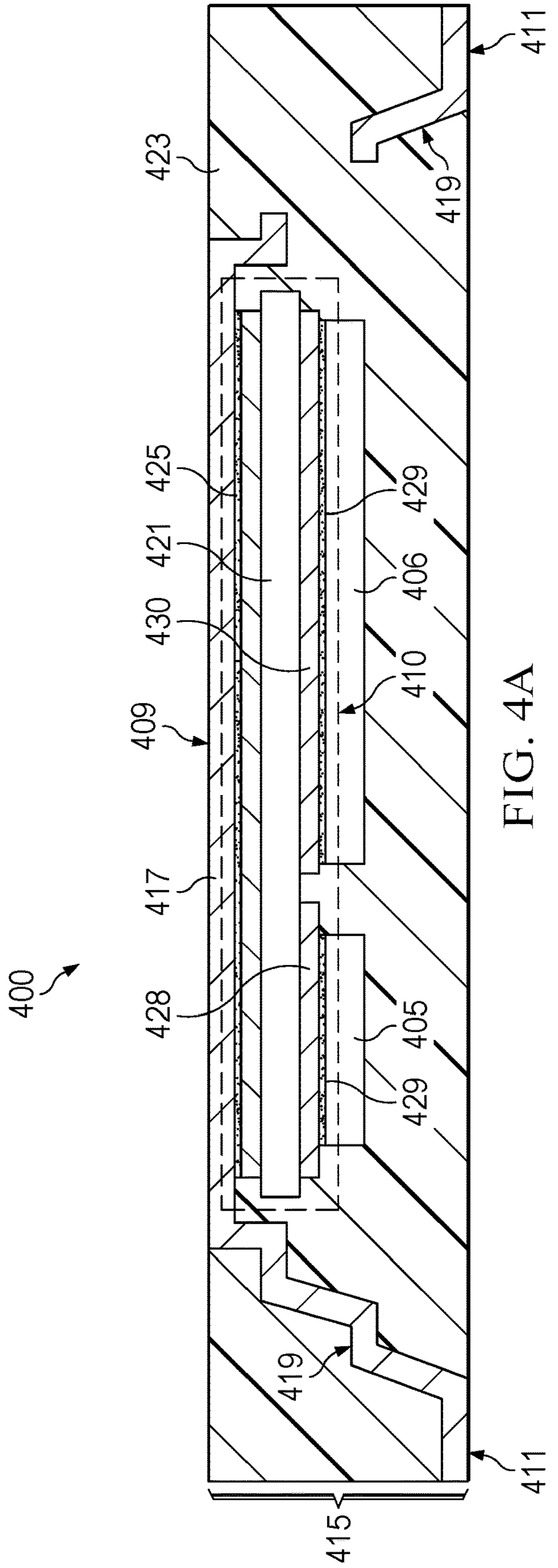
FIG. 4A illustrates, in a cross-sectional view, a portion of a TsQFN semiconductor package in an example arrangement.

FIG. 4A illustrates, in a cross-sectional view, a semiconductor device package 400 of an example arrangement. Semiconductor dies 405, 406 are mounted to a thermal dissipation structure 410 (shown in a dotted line in FIG. 4A). The thermal dissipation structure 410 includes a ceramic substrate 421, in this illustrated example a direct bonded copper (DBC) substrate is shown as ceramic substrate 421. The thermal dissipation structure 410 includes elements not visible in FIG. 4A, these are detailed in additional figures and described below. These elements include a substrate mount used to mount the DBC substrate to the lead frame, such as a thermally conductive metal or solder. Die attach (also not shown) is used to mount the semiconductor dies 405, 406 to the thermal dissipation structure 410. A lead frame 415 has a die pad 417 with a device side surface where the thermal dissipation structure 410 is mounted, and a thermal pad 409 on an opposite surface of the die pad 417. Leads 419 are part of the lead frame 415 and extend away from the die pad 417, and in the semiconductor device package 400, exposed portions of the leads 419 form terminals 411. Mold compound 423 covers the semiconductor dies, lead frame 415 and portions of the leads 419 and the die pad 417, while the thermal pad 409 and the terminals 411 are partially exposed from the mold compound 423. The thermal pad 409 provides a top side cooling surface for the semiconductor device package 400, and the terminals 411 provide connections from the semiconductor device package 400 to a system board or module. Bond wires that connect bond pads on the semiconductor dies 405, 406 to the lead frame leads 419 are not shown in FIG. 4A, for clarity of illustration. Semiconductor device package 400 is a TsQFN package.

The lead frame 415 has a dual downset shape, so that the lead frame 415 has a first die pad (417, shown at the top of the package 400 in FIG. 4A) in a first horizontal plane, leads 419 have a second horizontal plane is in the middle of the package 400 for making wire bond or ribbon bond connections, and the leads 419 have a third horizontal plane at the bottom or board side of the package 400, exposed portions of the leads 419 forming terminals 411 for mounting the package 400 to a system board. Other package substrates can be used. When the lead frame 415 is viewed looking from the die pad side, the die pad 417 of the lead frame 415 is downset twice from the exposed ends of the leads 419.

In a system application, the TsQFN package 400 can have a heat sink (not shown) mounted to the top side thermal pad to further enhance thermal dissipation. Forced air, or circulation of a coolant, cooled gas or a liquid, can be used to further cool the semiconductor device package 400 at the top side.

Figure 4B:
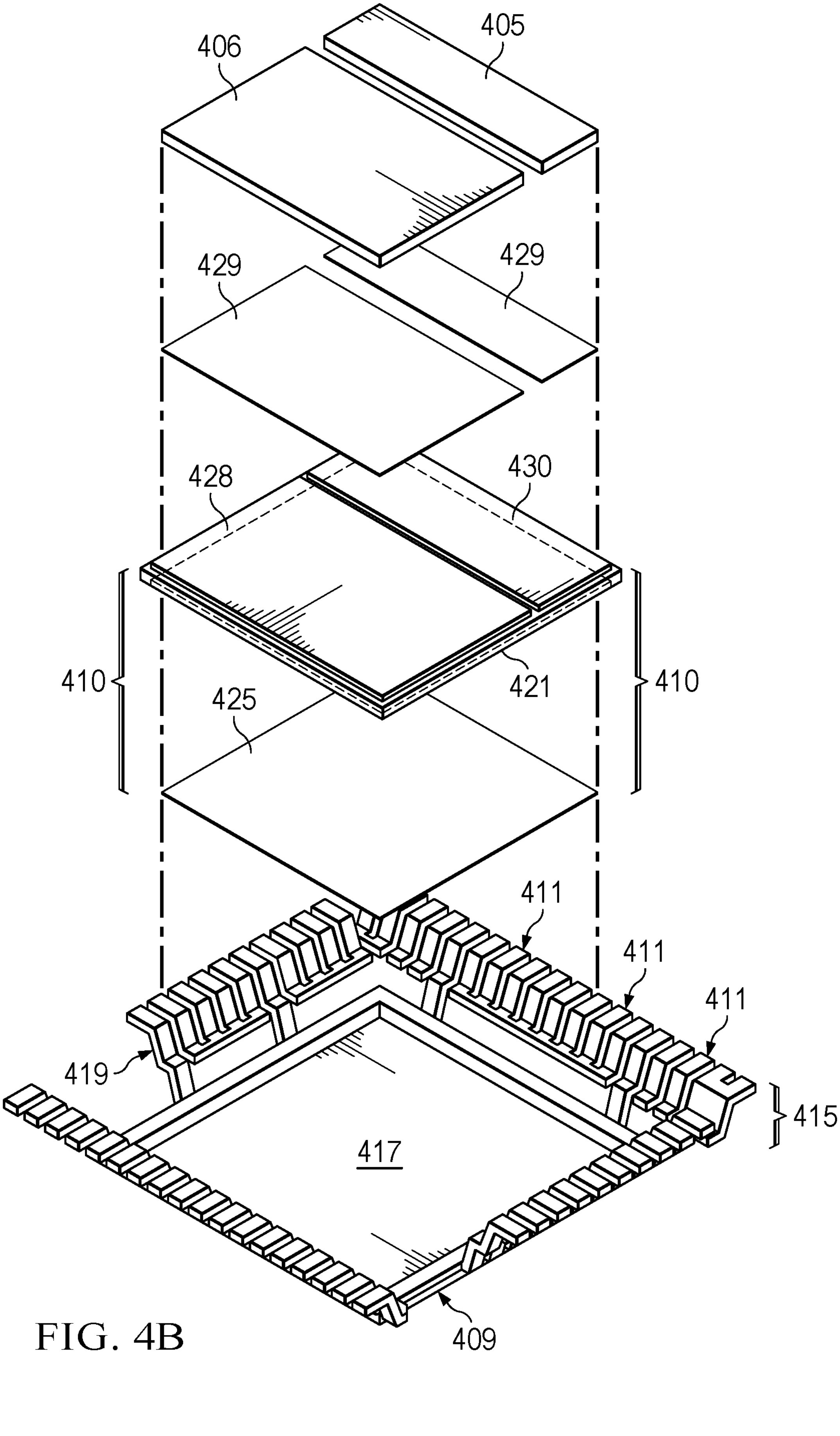
FIG. 4B illustrates, in an exploded view from a bottom side, elements of the TsQFN semiconductor package showing relationships of the elements in the example arrangement.

FIG. 4B illustrates, looking from a board side, an exploded view of the lead frame 415, the elements of the thermal dissipation structure 410, die attach 429, and the semiconductor dies 405, 406. (Lead frame 415 and the other elements are rotated when the view of FIG. 4B is compared to the view in FIG. 4A, for purposes of illustration.)

In FIG. 4B, the lead frame 415 include the die attach pad 417. Thermal dissipation structure 410 includes the ceramic substrate 421, here a direct bonded copper (DBC) substrate is shown, and a substrate mount 425. DBC substrate 421 includes a ceramic core and copper layers formed on each side of the ceramic core, the copper layers provide thermal connections to the thermally conductive insulator core. In the illustrated example, the ceramic core is aluminum nitride, and the copper layer on the die side is patterned to form two die mounting areas 428, 430. The substrate mount 425 can be of solder or sintered silver, or another highly thermally conductive material such a die attach. In an example, solder is used. The die mounts 428, 430 are electrically insulated from the die attach pad 417 by the ceramic core in substrate 421. Die attach material 429 is used to mount semiconductor dies 405, 406 to the substrate 421. In an example where an electrical contact is needed to the backside of the dies 405 or 406, the copper die mount portions 428, 430 of the thermal dissipation structure 410 can be coupled to a lead for making a ground connection, for example, or another potential can be connected to the copper die mounts and thus, to the backside of the semiconductor dies 405, 406. The semiconductor device dies 405, 406 are electrically isolated from one another by the spacing between patterned die mounts 428 and 430, and due to the insulating properties of the ceramic core of substrate 421. Use of the thermal dissipation structure 410 enables use of a low-cost ceramic substrate and eliminates the need for a TIM paste or film, which carries a higher cost and can result in voids or defects (for TIM pastes).

Figure 5A:
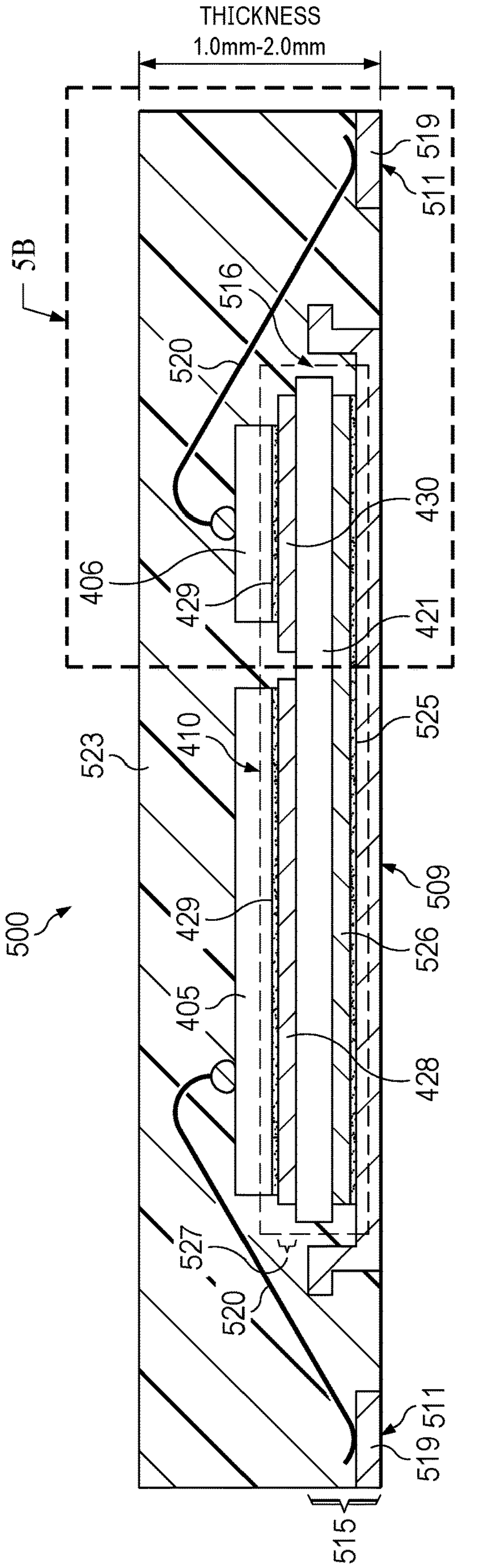
FIG. 5A illustrates, in a cross-section, a QFN package of an example arrangement.

FIG. 5A illustrates in a cross-sectional view a quad flat no lead (QFN) package 500 of an alternative example arrangement. In a different approach than the package 400 in FIG. 4A, the thermal path for package 500 includes a thermal pad 509 at the bottom or board side of the package, and the semiconductor dies and thermal dissipation structure are mounted on a die attach pad of the lead frame opposite the board side.

In FIG. 5A, semiconductor dies 405, 406 are shown mounted to thermal dissipation structure 410 on die mount portions 428, 430. A lead frame 515, which can be a partially etched lead frame or a premolded lead frame, is shown with a cavity 516 formed in a die attach pad. A thermal pad 509 is shown exposed from mold compound 523 on a board side of the package 500. Bond wires 520 are shown coupling the semiconductor dies 405, 406 to leads 519 of the lead frame 515, the leads 519 have exposed portions forming terminals 511 for the package 500. The thermal dissipation structure 410 includes elements not shown in FIG. 5A, for example a thermally conductive substrate mount attaches the thermal dissipation structure to the lead frame. Die attach material is not shown in FIG. 5A, but is shown in FIG. 4B (see substrate mount 425, die attach 429 in FIG. 4B). In the example arrangement shown in FIG. 5A, the lead frame 515 has a greater thickness than a standard lead frame to improve performance. In order to keep the overall package thickness from becoming too great, the cavity 516 is formed to provide the die pad, cavity 516 recesses the thermal dissipation structure and thereby reduces the overall thickness needed for the package 500. In alternative arrangement, the cavity 516 can be omitted, while the package thickness in these arrangements would be greater. Also, in additional alternative arrangements, the lead frame 515 can have a reduced thickness, for example a lead frame thickness of 8 mils, and thus the cavity 516 may not be used. In an example using the thick lead frame (in the example shown, a lead frame thickness of 20 mils was used) as shown in FIG. 5A, the lead frame 515 has a thickness of 0.5 millimeters, and for leaded packages where the package thickness includes the molded body and external leads extending from the package to a board mounting plane, the overall package thickness for package 500 can range from 3.5 to 5.5 millimeters. For no-lead packages where the total package thickness includes leads that are not extending away from the molded package body, the total package thickness can be between 1.0-2.0 millimeters, and packages incorporating the thermal dissipation structure of the arrangements can have a thickness of about 1.0 millimeters, which is the thickness of standard QFN packages. Use of the thermal dissipation structure 510 in the example arrangement shown in FIG. 5A provides a QFN package with increased thermal dissipation (compared to packages formed without use of the arrangements), while eliminating the TIM material used in prior approaches, increasing reliability while simultaneously reducing costs.

Figure 5B:
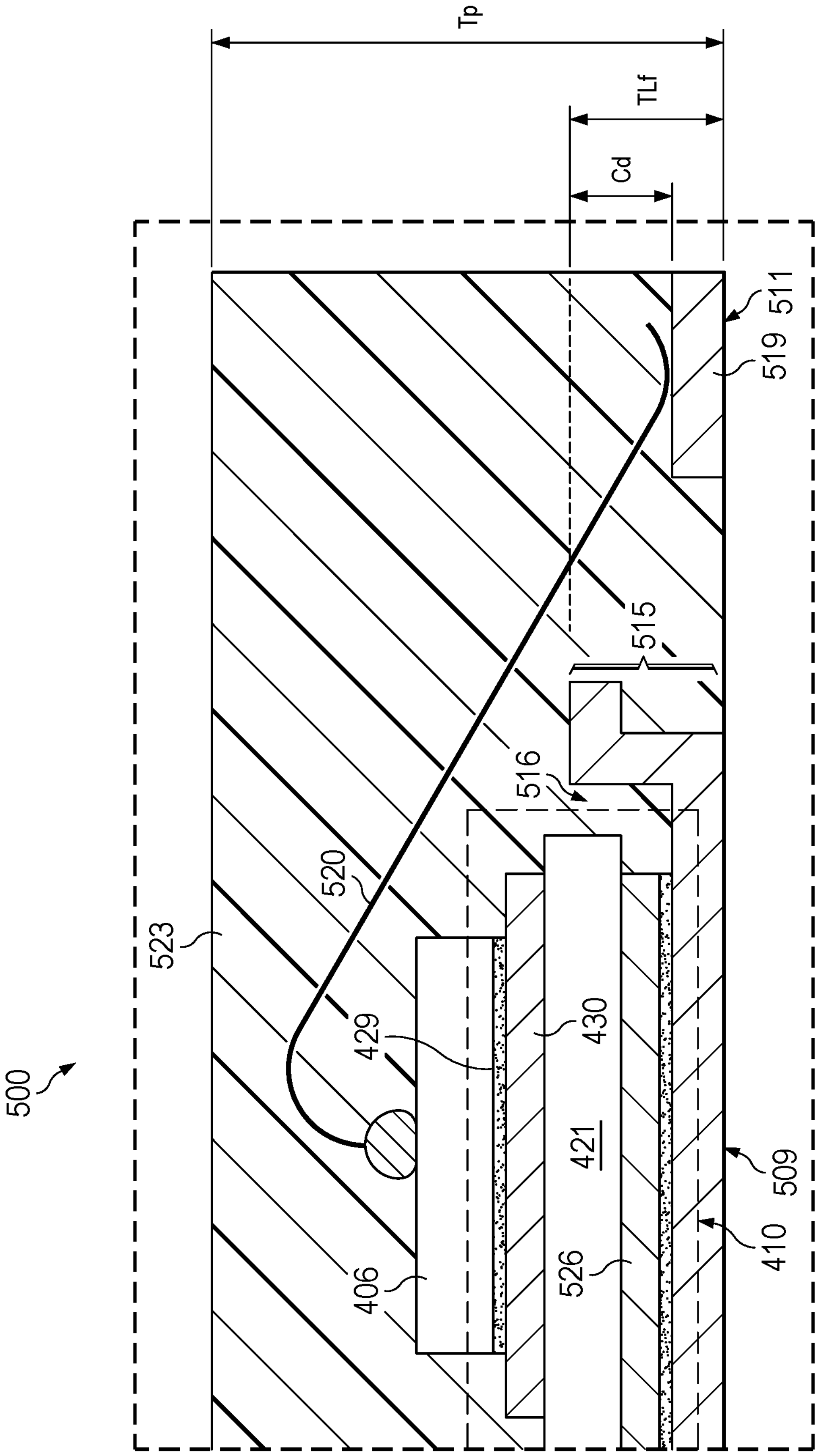
FIG. 5B illustrates in a close-up view elements of the arrangement showing relationships of the elements in the example arrangement.

FIG. 5B illustrates, in a close-up cross-sectional view, details for the example arrangement of FIG. 5A. In FIG. 5B, lead frame 515 is shown with a lead frame thickness "Tlf". In an example the lead frame 515 has a thickness of about 20 mils, or about 0.5 millimeters. The thick lead frame 515 provides low thermal resistance in the die pad area with cavity 516, and low electrical resistance for the leads 519 (compared to standard lead frame of less thickness, for example a thickness of 8 mils or about 0.1-0.2 millimeters). In the die pad area cavity 516 is formed on the device side surface of the lead frame 515, the cavity 516 has a depth "Cd" that can vary from 0.1-0.4 millimeters. By varying the cavity depth Cd of the cavity 516, the thick lead frame 515 can be packaged in a semiconductor device package of about 1.0 millimeters (about 40 mils) package thickness "Tp", a standard thickness for QFN packages. In examples, the package thickness Tp can be between 1.0-2.0 mm for a no-lead package or QFN package. Use of the cavity 516 is optional, however, and in an alternative arrangement, the cavity is not used, packages formed without the cavity 516 can have greater thickness Tp. For an alternative arrangement using a leaded package, where leads extend from the mold compound to form feet for mounting to a system board, the package thickness Tp includes the leads and the molded body and can be between 3.5 and 5.5 millimeters.

Thermal dissipation structure 410 has a thickness determined by the materials used in the ceramic substrate, (in the illustrated example of FIG. 5B a DBC substrate with copper layers on either side of a ceramic core is used), and by the substrate mount material used to mount the DBC substrate to the die pad, and by the die attach used to mount the semiconductor die to the thermal dissipation structure. In the illustrated example, the ceramic core of aluminum nitride for the DBC substrate has a thickness between 0.2-0.26 millimeters. The copper layers on either side of the ceramic core have thicknesses of about 0.12-0.13 millimeters, while the substrate mount and the die attach layers have a thickness of about 0.025 millimeters. The semiconductor die 406 has a thickness, in one example, of about 0.254 millimeters. By adding these thicknesses, the total thickness from the board side of the device package 500 to the top of the semiconductor die can range from 0.85-0.95 millimeters. The use of the cavity 516 with a depth Cd makes it possible to form a semiconductor device package 500 including the thermal dissipation structure 410 using mold compound 523 over the semiconductor dies with a total thickness Tp of around 1.0 millimeter. In an alternative arrangement where the cavity 516 is not used with the thick lead frame, the resulting semiconductor device package will have a thickness greater than 1.0 millimeters, for example 1.4-2.0 millimeters. In another alternative, a standard lead frame thickness of about 8 mils is used, instead of the thick lead frame shown in FIG. 5A.

FIGS. 5C-5H illustrate, in a series of cross-sectional views, major steps used in forming the semiconductor device package 500 shown in FIG. 5A.

Figure 5C:
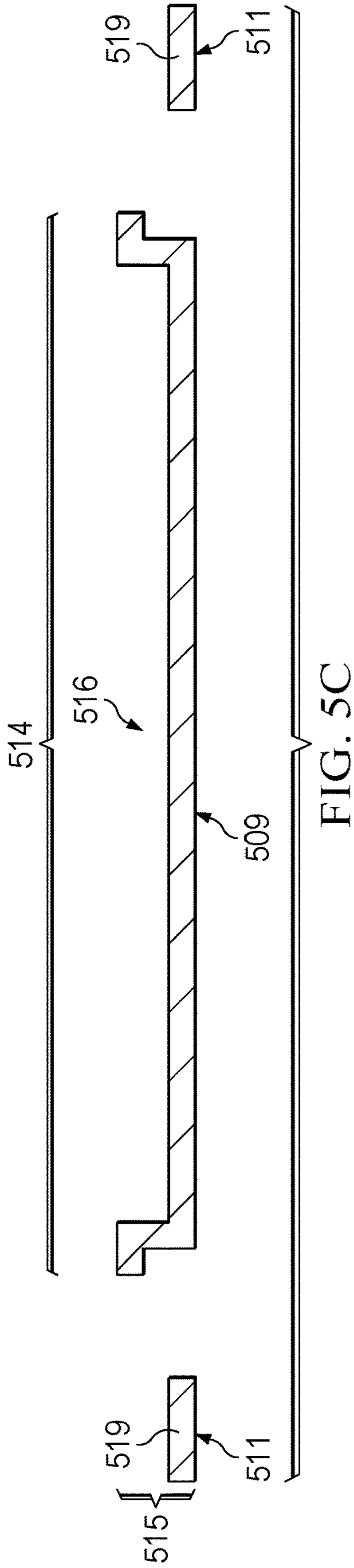
FIGS. 5C-5H illustrate, in a series of cross-sections, selected steps of a method for forming the example arrangements.

In FIG. 5C, a unit portion of lead frame 515 is shown in a cross-sectional view. The lead frame 515 can be formed using partial etching. A practical example will have many unit portions formed in a grid, strip or array. In the manufacture of partially etched lead frames, a sheet of metal, such as for example copper or a copper alloy, is patterned using etch processes performed from both sides of the sheet. In this manner, features with a recessed portion extending from the device side surface, from the board side surface, or both, can be formed. Openings extending entirely through the lead frame 515 between leads or other features can be formed by partial etching from both sides in the same location, to remove all of the lead frame material and form an opening. In FIG. 5C, leads 519 are spaced from die pad 514 which has cavity 516 etched into it from the device side surface. Other package substrates can be used, and the lead frame 515 can be partially molded to form a premolded lead frame (PMLF) as an alternative arrangement. The lead frame 515 shown in FIG. 5C can be a thick lead frame of a thickness of about 20 mils, as shown in FIG. 5B. Alternatively, a standard lead frame thickness of about 8 mils can be used. The cavity 516 is helpful in forming a package with a thickness of about 1 millimeters while using the thermal dissipation structure of the arrangements. However, in alternative arrangements, the cavity 516 can be omitted.

Figure 5D:
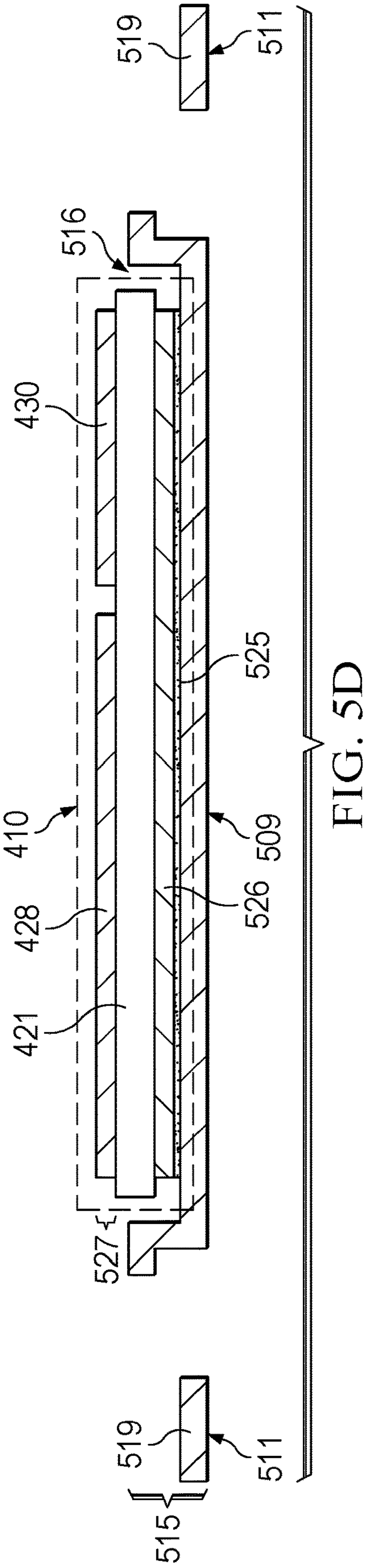

FIG. 5D illustrates in a cross-sectional view the elements of FIG. 5C after additional processing. In FIG. 5D, the thermal dissipation structure 410 is shown mounted to the lead frame 515 in the die pad cavity 516. Substrate mount material 525 is used to adhere the board side surface of a copper layer 526 on the board side surface of ceramic substrate 421 of the thermal dissipation structure 410 to the lead frame. The substrate mount 526 can be a solder or a sintered silver material, or another material with high thermal conductivity such as a die attach material. Sintered silver can be applied as a powder in paste form and heated to a solid in a sintering process without a liquid phase, and like solder, the sintered silver acts as a thermal conductor that also mechanically attaches the thermal dissipation structure 410 to the cavity 516. The copper layer 527 on the device side surface of the DBC has been patterned to form two die mount portions 428, 430 that are spaced from one another and are electrically isolated from one another. The ceramic substrate 421 is the core of a DBC substrate that can be provided by a substrate vendor with the copper layers 526, 527 patterned by etch or by being patterned as the copper is deposited on the ceramic core. In additional arrangements, other thermally conductive insulator core substrates can be used instead of the DBC substrate. Alternatives include an insulated metal substrate (IMS) and an active metal brazed (AMB) substrate. Laminate substrates can be used.

Figure 5E:
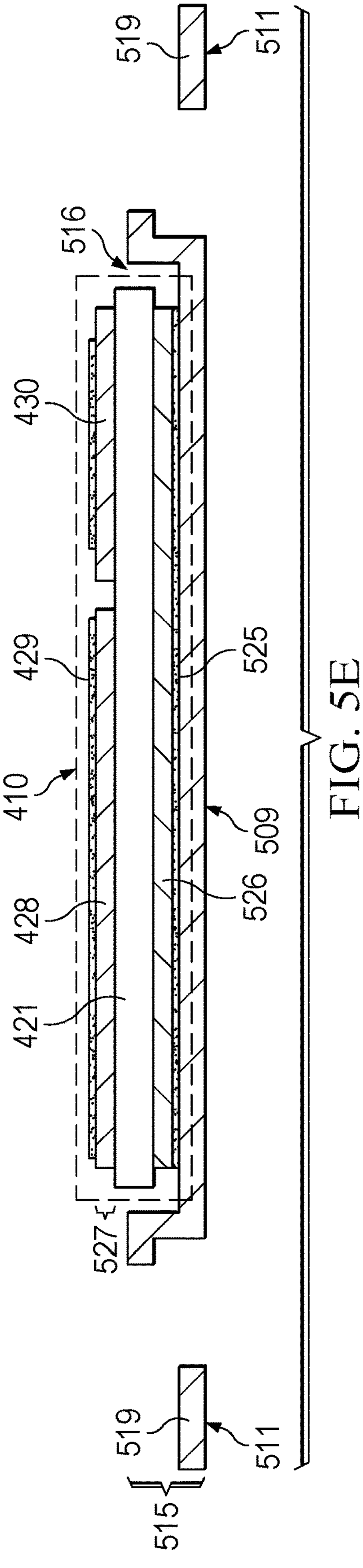

FIG. 5E illustrates, in a further cross-sectional view, the elements of FIG. 5D after an additional process step. In FIG. 5E, die attach material 429 is shown deposited on the die mount portions 428 and 430. The thermal dissipation structure 410 includes the substrate mount 525, the DBC substrate with copper layers 526 and 527 over a ceramic core 421. The die attach material 429 is deposited on the device side surface of the thermal dissipation structure 410.

Figure 5F:
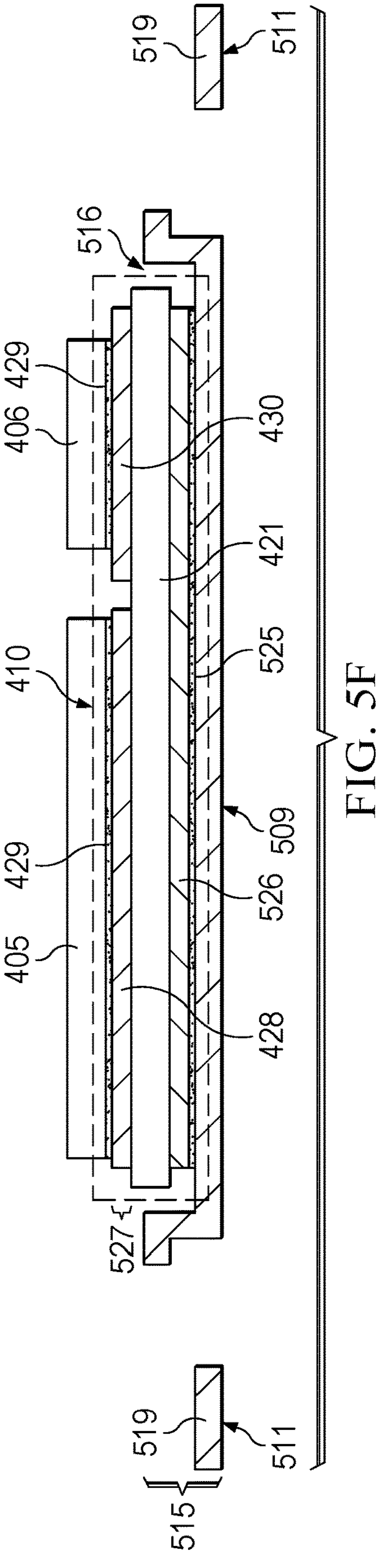

FIG. 5F illustrates in another cross-sectional view the elements of FIG. 5E after additional processing. In FIG. 5F, the semiconductor dies 405, 406 are shown mounted to the thermal dissipation structure 410. Die attach material 429 is used to adhere the semiconductor dies 405, 406 to the copper die mount portions 428 and 430. In an example arrangement, conductive die attach film or conductive die attach paste is used to thermally and electrically couple the backside of the semiconductor dies 405 and 406 to the die mount portions 428, 430. In an alternative arrangement, a non-conductive die attach material can be used where no electrical contact is needed to the backside surface of the semiconductor dies 405 and 406.

Figure 5G:
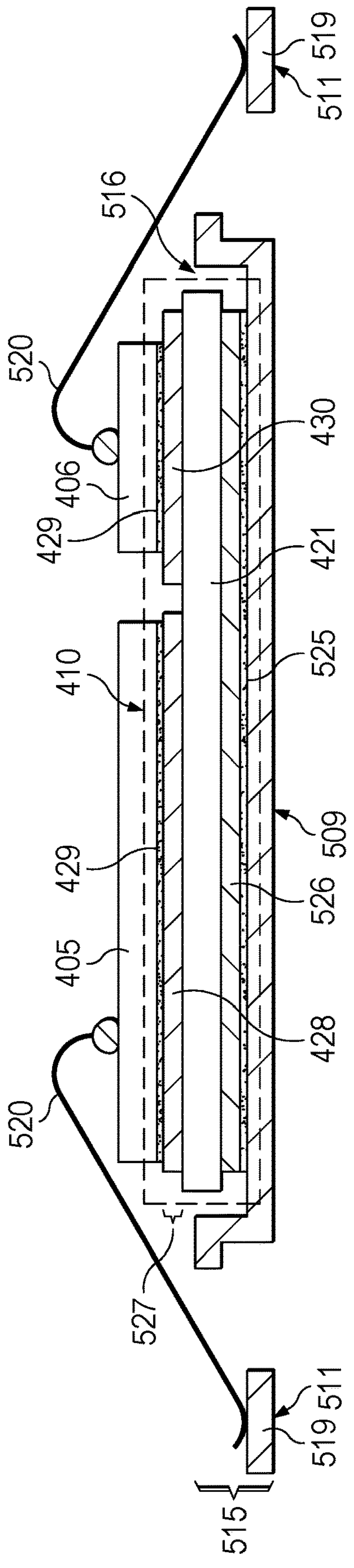

FIG. 5G illustrates, in a further cross-sectional view, the elements of FIG. 5F after a wire bonding process. In FIG. 5G, wire bonds 520 are shown coupling the semiconductor dies 405 and 406 to leads 519 of the lead frame 515. The wire bonds 520 can be formed using a ball and stitch wire bonding tool. In an example process the wire bonding tool has a capillary with a bond wire extending through an opening. A flame or electric arc is used to form a molten ball on the end of the bond wire. The capillary moves (or alternatively the semiconductor die can be moved by a movable support table) so that the molten ball is positioned over a bond pad on a semiconductor die. The wire bonding tool applies mechanical pressure to push the molten ball onto the bond pad. Thermal and sonic energy can be applied to form a stronger bond between the ball and the bond pad, a process sometimes referred to as thermosonic wire bonding. After the ball is bonded to the semiconductor die, the capillary moves away while allowing the bond wire to extend from the opening in the capillary, forming an arc shape. The capillary then is used to form a stitch bond on a lead of the lead frame, using mechanical pressure and sonic energy to vibrate the capillary, and thermal energy to increase the bond strength. After the stitch bond is formed, the capillary again moves away from the lead, and the bond wire is cut by cutters in the bond wire tool leaving a short tail extending from the stitch bond. Automated wire bonders can form multiple ball and stitch wire bonds per second, and the automated bonding process is fast, well understood, and relatively low in cost. Bond wires that can be used include bare copper, palladium coated copper, gold, silver, aluminum, palladium and alloys of these. In an example arrangement, copper bond wires are used. The wire bonding tool may have an anoxic atmosphere to reduce oxidation of the bond wires during the process.

Figure 5H:
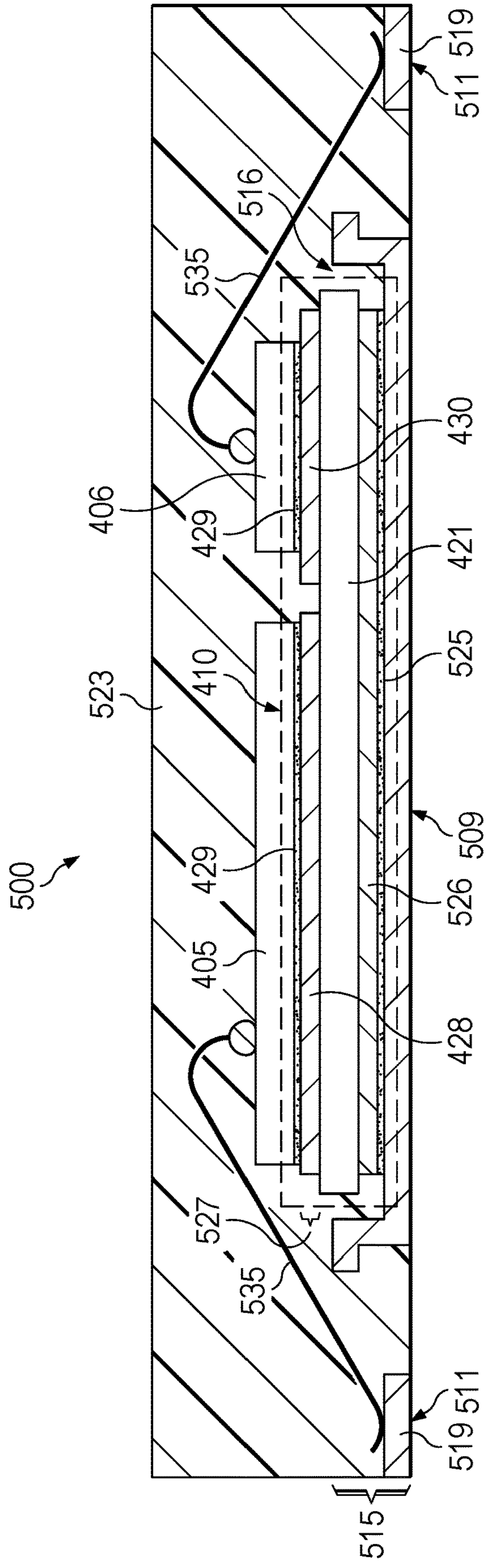

FIG. 5H illustrates, in another cross-sectional view, the elements of FIG. 5G after a molding process completes the semiconductor device package 500. Note that the illustration of the semiconductor device package 500 in FIG. 5A corresponds to the illustration in FIG. 5H, although with fewer details shown. In FIG. 5H, mold compound 523 is shown formed over the elements shown in FIG. 5G. In an example process, lead frames carrying the semiconductor dies are provided in a strip or array with units temporarily tied together by removeable tie bars, after the wire bonding process makes the semiconductor device dies ready for molding. The lead frames are loaded into a mold chase of a mold tool. Electronic mold compound (EMC), which can be an epoxy resin and which may include fillers to enhance thermal dissipation and strength is loaded into the tool. In an example process, a solid puck is used, or a solid powdered mold compound can be used. The mold compound, a solid at room temperature, is heated to a liquid state and once liquid, forced through runners into the mold chase, for example a mechanical ram can push the liquid mold compound into the mold chase. The liquid mold compound surrounds the semiconductor dies, the bond wires, the thermal dissipation structure, and portions of the leads and the lead frame. As shown in FIG. 5H, some portions of the lead frame 515 are left exposed from the mold compound to form the terminals 511 and thermal pad 509 of the semiconductor device package 500. After the mold compound 523 cures, it forms a solid package body to protect the devices. The mold compound is a thermoset plastic, so that it will remain solid after curing.

The thermal performance of the arrangements used to form TsQFN semiconductor device packages (see semiconductor device package in FIG. 4A) and QFN semiconductor device packages (see semiconductor device package 500 in FIG. 5A) have been evaluated in mechanical simulations and the results compared to similar packages formed without use of the arrangements. The TsQFN semiconductor device package (see semiconductor device package 400 in FIG. 4A) with the integrated thermal dissipation structure and formed without the use of the TIM materials of prior approaches was evaluated with an ambient temperature of 55 degrees Celsius, and a maximum junction temperature for a power FET in the package of 73.54 degrees Celsius, and in the mechanical simulations, a thermal resistance of 1.85K/W (Kelvin/Watt) was observed. In comparison, a similar semiconductor device package formed without use of the thermal dissipation structures of the arrangements has a thermal resistance of ranging between 1.9-2.1K/W, so that use of the arrangements improved thermal performance by 10-12%.

The use of the thermal dissipation structure of the QFN semiconductor device package (see semiconductor device package 500 in FIG. 5A) in example arrangements was further evaluated in simulation and an even lower thermal resistance of 1.55K/W was obtained, improving performance over prior approaches of QFN.

The use of the arrangements provides a packaged semiconductor device with enhanced thermal dissipation, without the need to change the design of the semiconductor device dies, and without the need to change board designs, and using existing methods and tooling for making the packaged devices. The semiconductor device packages formed incorporating the thermal dissipation structures of the arrangements are free from the TIM materials used in prior approaches, lowering costs while increasing thermal performance.

Figure 6:
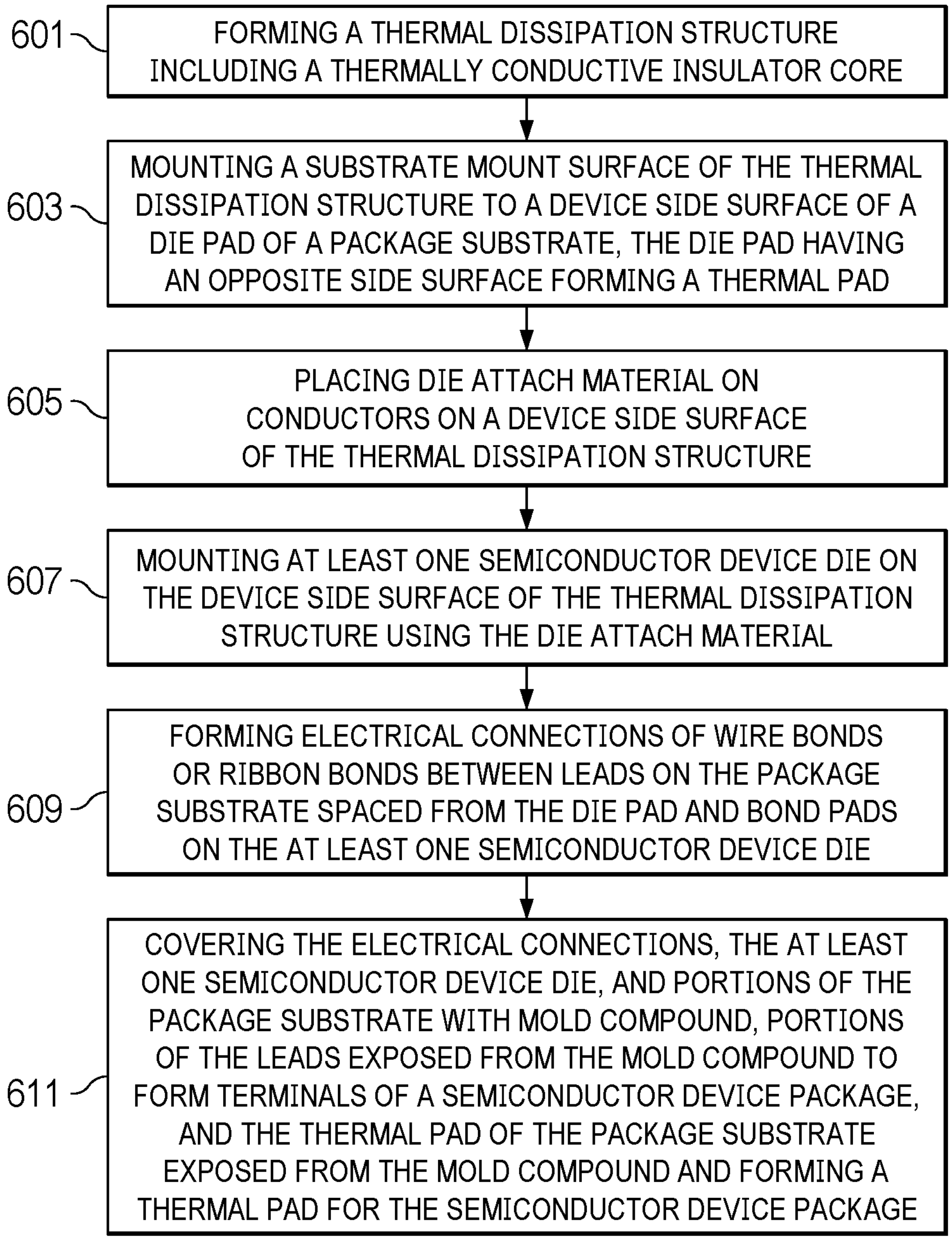
FIG. 6 illustrates in a flow diagram selected steps of a method for forming the arrangements.

FIG. 6 illustrates, in a flow diagram, method steps for forming the semiconductor device packages of the arrangements. At step 601, thermal dissipation structures are formed. Thermal dissipation structures that can be used in the arrangements have a thermally conducting insulating core, in an example a direct bonded copper (DBC) substrate is used with an aluminum nitride ceramic core and copper conductors on a substrate mount surface and on a device side surface (see thermal dissipation structure 410 in FIG. 4B, for example, including DBC substrate 421 and a substrate mount material 425).

At step 603, the substrate mount surface of the thermal dissipation structure is mounted to the device side surface of the package substrate, the die pad having an opposite side surface forming a thermal pad. In the illustrated arrangements, the package substrate is a lead frame with a die pad on a device side surface, and having a thermal pad on the opposite side surface of the die pad. (See, for example, lead frame 515 in FIGS. 5C, 5D, with thermal dissipation structure 410 mounted in the cavity 516 on the die pad of the lead frame 515 shown in FIG. 5D, and see FIG. 5H, where the opposite side surface of the die pad is shown as thermal pad 509.)

At step 605 in FIG. 6, die attach material is placed on conductors on a device side surface of the thermal dissipation structure. (See FIG. 5E where die attach material 429 is shown on the conductors in layer 527 formed on the device side surface of the thermal dissipation structure 410).

At step 607, at least one semiconductor device die, and in the examples, two semiconductor device dies, are mounted on the thermal dissipation structure using the die attach material. (See, for example, FIG. 5F, where semiconductor device dies 405, 406 are mounted on the conductors on the device side surface of the thermal dissipation structure 410 using die attach material 429.)

At step 609, electrical connections of wire bond or ribbon bonds are formed between leads on the package substrate spaced from the die pad and bond pads on the at least one semiconductor device die. (See, for example, wire bonds 535 formed between leads 519 and bond pads on the semiconductor device dies 405, 406 in FIG. 5G).

At step 611, the electrical connections, the at least one semiconductor device die, and portions of the package substrate are covered with mold compound, while portions of the leads exposed from the mold compound form terminals for a semiconductor device package, and the thermal pad of the package substate is exposed from the mold compound and forms a thermal pad of the semiconductor device package. (See FIG. 5G and FIG. 5H, showing mold compound 523, the terminals 511, and the thermal pad 509 exposed from the mold compound 523.)

The steps of the flow chart in FIG. 6 can be used to form the TsQFN package 400 of FIG. 4A, where the thermal pad is exposed at a top side of the semiconductor device package, or can be used to form the QFN package 500 of FIGS. 5A, 5H where the thermal pad is exposed from the mold compound on a board side surface of the semiconductor device package. In various applications, the cooling path from the semiconductor device package can be into a thermal pad on a system board, for the QFN packages, or using a heat sink or cooling path at the top side of the TsQFN packages, where forced air, circulating liquids or cooling gasses can be used to carry heat away from the semiconductor device packages. Additional arrangements can also provide a thermal dissipation structure with an exposed thermal pad for leaded semiconductor device packages, on the top side of the leaded semiconductor device packages.

Modifications are possible in the described arrangements, and other alternative arrangements are possible within the scope of the claims.

What is claimed is:

1. A method, comprising:

forming a thermal dissipation structure comprising a thermally conductive insulator core and having a device side surface and a substrate mount surface opposite the device side surface;

mounting the substrate mount surface of the thermal dissipation structure to a device side surface of a die pad of a package substrate, the die pad acting as a thermal pad;

placing die attach material on the device side surface of the thermal dissipation structure;

mounting at least one semiconductor device die on the device side surface of the thermal dissipation structure using the die attach material;

forming electrical connections between leads of the package substrate spaced from the die pad and bond pads on the at least one semiconductor device die; and covering the electrical connections, the at least one semiconductor device die, and portions of the package substrate with mold compound, portions of the leads of the package substrate exposed from the mold compound forming terminals for a semiconductor device package, and the die pad exposed from a top side surface of the semiconductor device package, wherein the terminals are exposed from a board side surface of the semiconductor device package opposite the top side surface.

2. The method of claim 1, wherein forming the thermal dissipation structure comprises forming thermal conductors on the thermally conductive insulator core, the thermal conductors on the device side surface and on the substrate mount surface.

3. The method of claim 1, wherein the thermally conductive insulator core comprises aluminum oxide, aluminum nitride, or silicon nitride.

4. The method of claim 2, wherein the thermal conductors comprise copper or copper alloy.

5. The method of claim 1, wherein the thermal dissipation structure comprises a direct bonded copper (DBC) substrate.

6. The method of claim 1, wherein the substrate mount surface of the thermal dissipation structure is mounted to the device side surface of the die pad using a substrate mount material of solder, sintered silver, or die attach material.

7. The method of claim 1, wherein the package substrate is a metal lead frame comprising copper, Alloy 42, stainless steel, or alloys thereof.

8. The method of claim 1, wherein the semiconductor device package is a top side cooled quad flat no-lead (TsQFN) package.

9. The method of claim 1, wherein the semiconductor device package is a leaded semiconductor device package with portions of the leads extending from the mold compound.

10. The method of claim 1, wherein the package substrate is a metal lead frame, the die pad has a cavity, and the thermal dissipation structure is mounted to the die pad in the cavity.

11. The method of claim 10, wherein the metal lead frame has a thickness of about 0.5 millimeters.

12. The method of claim 1, wherein the package substrate is a metal lead frame, and the metal lead frame has a thickness of between 0.1 and 0.2 millimeters.

13. An apparatus, comprising:

a package substrate having a die pad with a device side surface and leads spaced from the die pad, the die pad acting as a thermal pad;

a thermal dissipation structure mounted to the device side surface of the die pad, the thermal dissipation structure comprising a thermally conductive insulator core and having thermal conductors on a device side surface and on a substrate mount surface opposite the device side surface;

at least one semiconductor device die mounted to the device side surface of the thermal dissipation structure using a die attach material;

electrical connections formed between the leads and bond pads on the at least one semiconductor device die; and mold compound covering the electrical connections, the at least one semiconductor device die, and portions of the package substrate, portions of the leads exposed from the mold compound forming terminals, and the die pad exposed from a top side surface of the apparatus, wherein the terminals are exposed from a board side surface of the apparatus opposite the top side surface.

14. The apparatus of claim 13, wherein the thermal dissipation structure comprises a direct bonded copper (DBC) substrate.

15. The apparatus of claim 13, wherein the thermally conductive insulator core comprises aluminum nitride, aluminum oxide, or silicon nitride.

16. The apparatus of claim 13, wherein the thermal dissipation structure comprises an insulated metal substrate (IMS), an active metal brazed substrate (AMS), or a laminate substrate.

17. The apparatus of claim 13, wherein the apparatus is a top side cooled quad flat no-lead (TsQFN) package.

18. The apparatus of claim 13, wherein the apparatus is a leaded semiconductor device package.

19. The apparatus of claim 13, wherein the apparatus is free from thermal interface material (TIM).

20. The apparatus of claim 13, wherein the die pad has a cavity, and the thermal dissipation structure is positioned in the cavity.

21. The apparatus of claim 13, wherein the package substrate has a thickness measured at the die pad of about 0.5 millimeters, and the apparatus has a thickness of between 1.0-2.0 millimeters.

22. A semiconductor device package, comprising:

a metal lead frame having a die pad with a device side surface and leads spaced from the die pad, the die pad acting as a thermal pad;

a thermal dissipation structure mounted to the device side surface of the die pad, the thermal dissipation structure comprising a thermally conductive insulator core and thermal conductors on a substrate mount surface and on a device side surface;

at least one semiconductor device die mounted to the device side surface of the thermal dissipation structure using a die attach material;

electrical connections formed between the leads and bond pads on the at least one semiconductor device die; and mold compound covering the electrical connections, the at least one semiconductor device die, and portions of the metal lead frame, portions of the leads exposed from the mold compound forming terminals, and the die pad exposed from a top side surface of the semiconductor device package, wherein the terminals are exposed from a board side surface of the semiconductor device package opposite the top side surface.

23. The semiconductor device package of claim 22, wherein the thermal dissipation structure comprises a direct bonded copper (DBC) substrate.

24. The semiconductor device package of claim 22, wherein the thermally conductive insulator core comprises aluminum oxide, aluminum nitride, or silicon nitride.

25. The semiconductor device package of claim 22, wherein the semiconductor device package is a top side cooled quad flat no-lead (TsQFN) package.

* * * * *